(12) United States Patent
Hou et al.

(10) Patent No.: US 11,749,681 B2
(45) Date of Patent: Sep. 5, 2023

(54) FIN FIELD-EFFECT TRANSISTOR AND METHOD OF FORMING THE SAME

(71) Applicant: Taiwan Semiconductor Manufacturing Company Limited, Hsinchu (TW)

(72) Inventors: Duen-Huei Hou, Hsinchu (TW); Chao-Cheng Chen, Hsinchu (TW); Chun-Hung Lee, Hsinchu (TW); Hsin-Chih Chen, Tucheng (TW); Kuo-Chin Liu, Hualien County (TW); J. H. Wang, Hsinchu (TW)

(73) Assignee: TAIWAN SEMICONDUCTOR MANUFACTURING COMPANY LIMITED, Hsinchu (TW)

( * ) Notice: Subject to any disclaimer, the term of this patent is extended or adjusted under 35 U.S.C. 154(b) by 189 days.

(21) Appl. No.: 17/195,984

(22) Filed: Mar. 9, 2021

(65) Prior Publication Data
US 2021/0366909 A1   Nov. 25, 2021

Related U.S. Application Data

(60) Provisional application No. 63/029,018, filed on May 22, 2020.

(51) Int. Cl.
*H01L 29/76* (2006.01)
*H01L 29/94* (2006.01)
*H01L 27/092* (2006.01)
*H01L 29/06* (2006.01)
*H01L 29/78* (2006.01)

(52) U.S. Cl.
CPC ...... *H01L 27/0924* (2013.01); *H01L 29/0649* (2013.01); *H01L 29/7851* (2013.01)

(58) Field of Classification Search
CPC ............. H01L 27/0924; H01L 29/0649; H01L 29/7851; H01L 29/66818; H01L 29/7853; H01L 29/66795
USPC ........................................................ 257/288
See application file for complete search history.

(56) References Cited

U.S. PATENT DOCUMENTS

2011/0068407 A1*  3/2011  Yeh ................... H01L 21/02535
257/369

* cited by examiner

*Primary Examiner* — Theresa T Doan
(74) *Attorney, Agent, or Firm* — FOLEY & LARDNER LLP

(57) ABSTRACT

A semiconductor device includes a first semiconductor fin that is formed over a substrate and extends along a first lateral axis. The semiconductor device includes a second semiconductor fin that is also formed over the substrate and extends along the first lateral axis. At least a tip portion of the first semiconductor fin and at least a tip portion of the second semiconductor fin bend toward each other along a second lateral axis that is perpendicular to the first lateral axis.

20 Claims, 18 Drawing Sheets

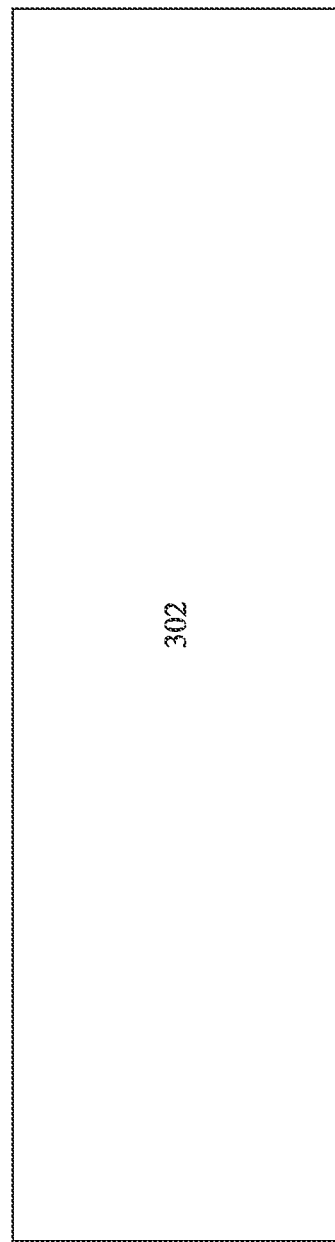

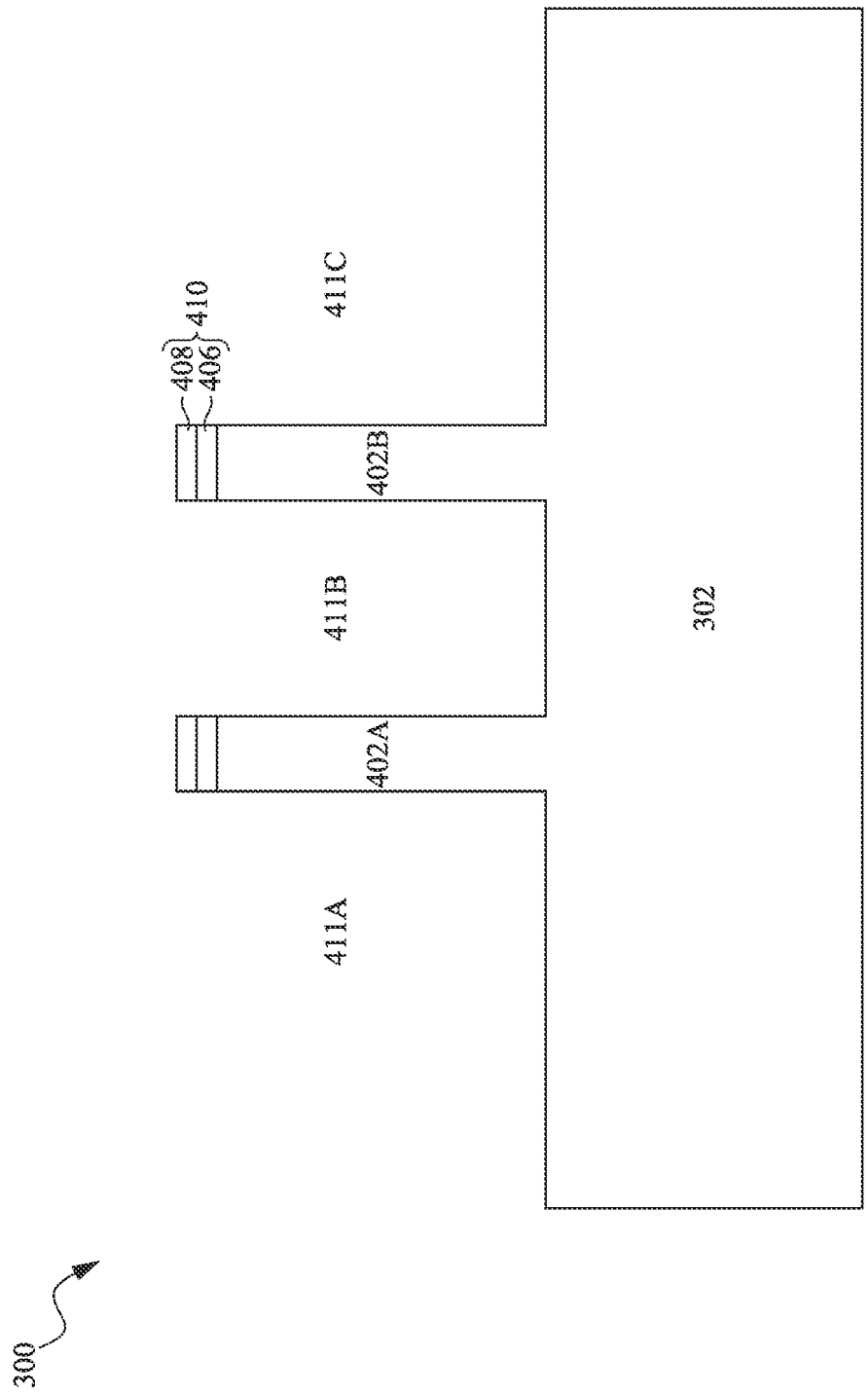

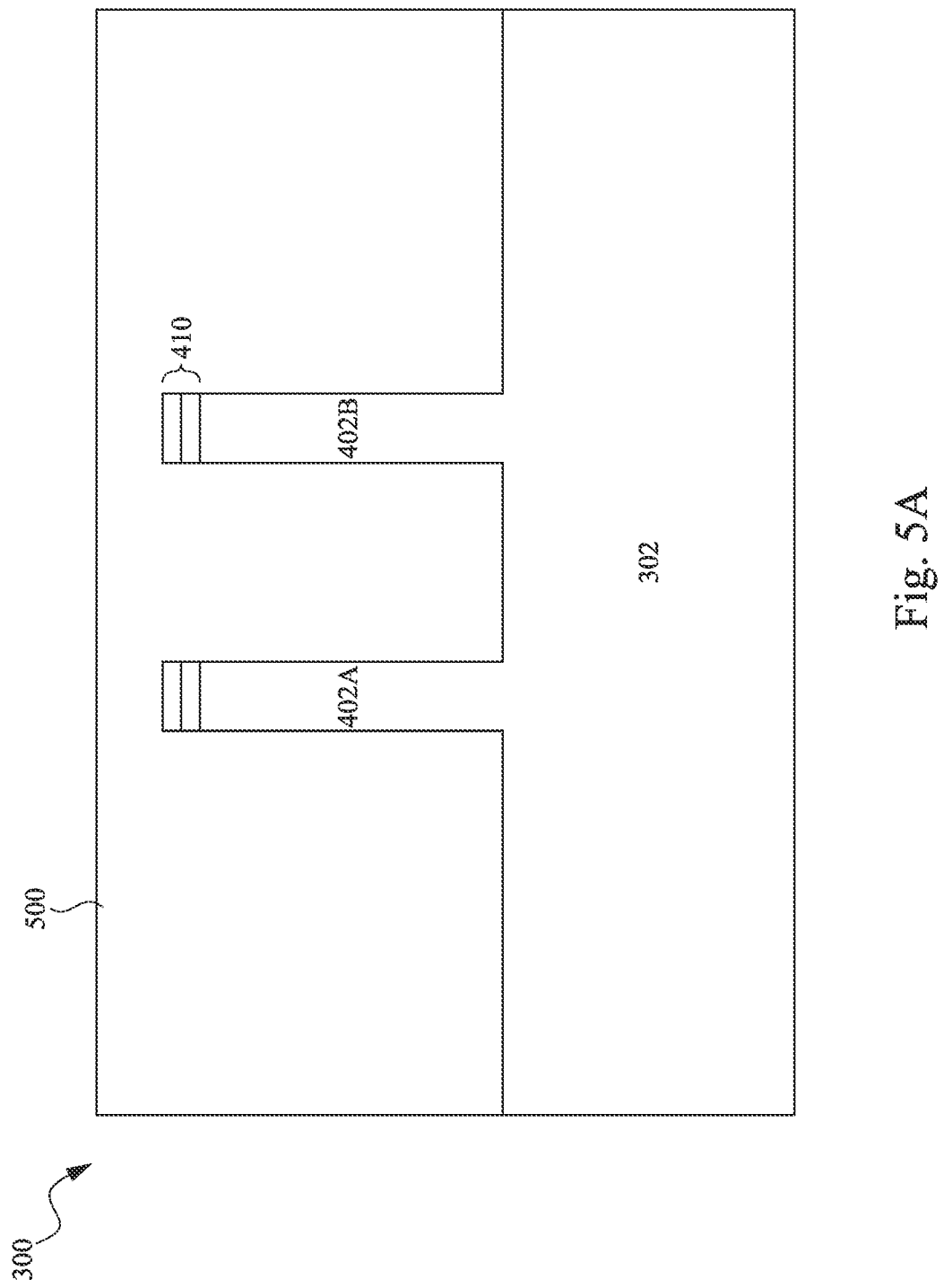

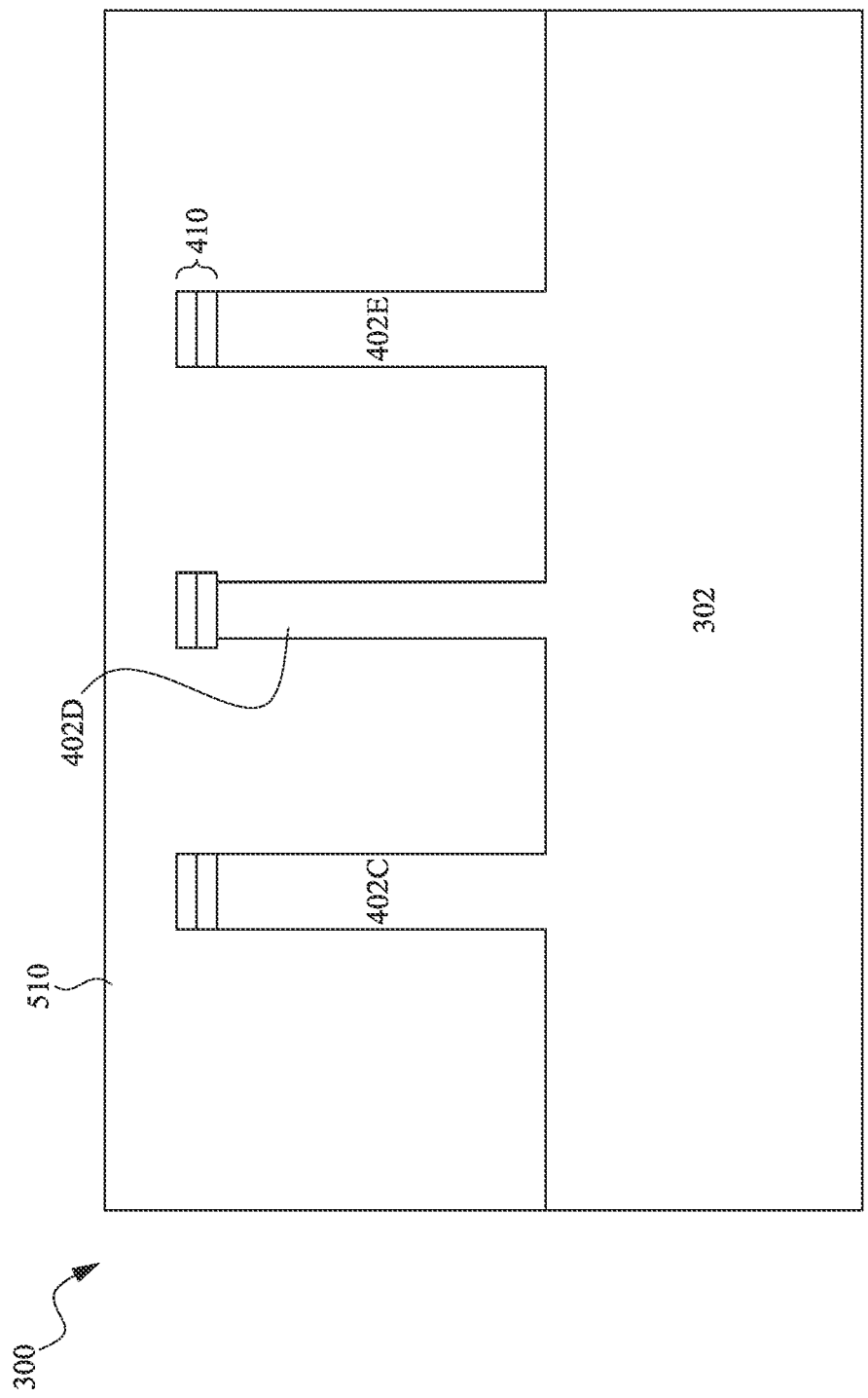

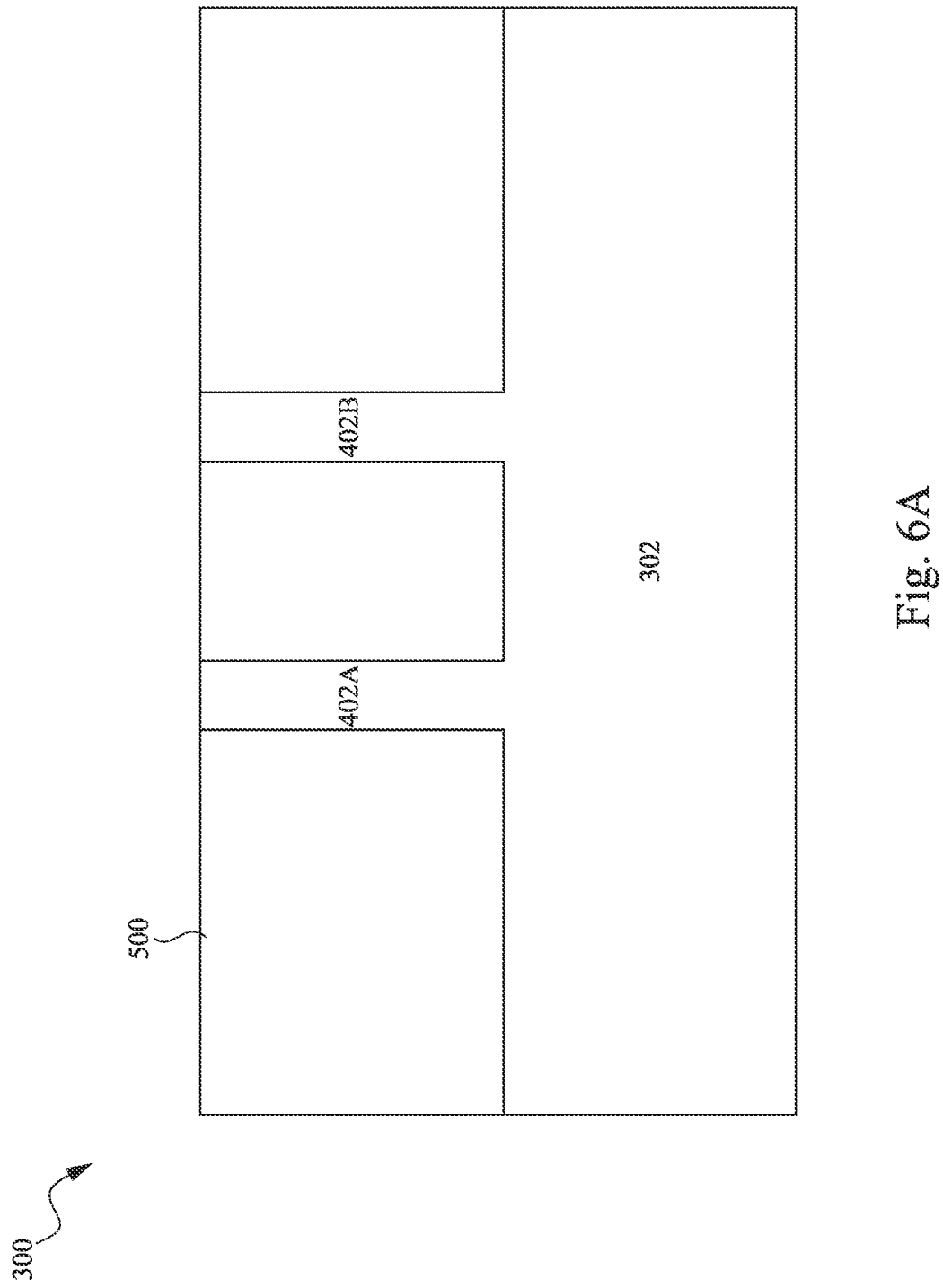

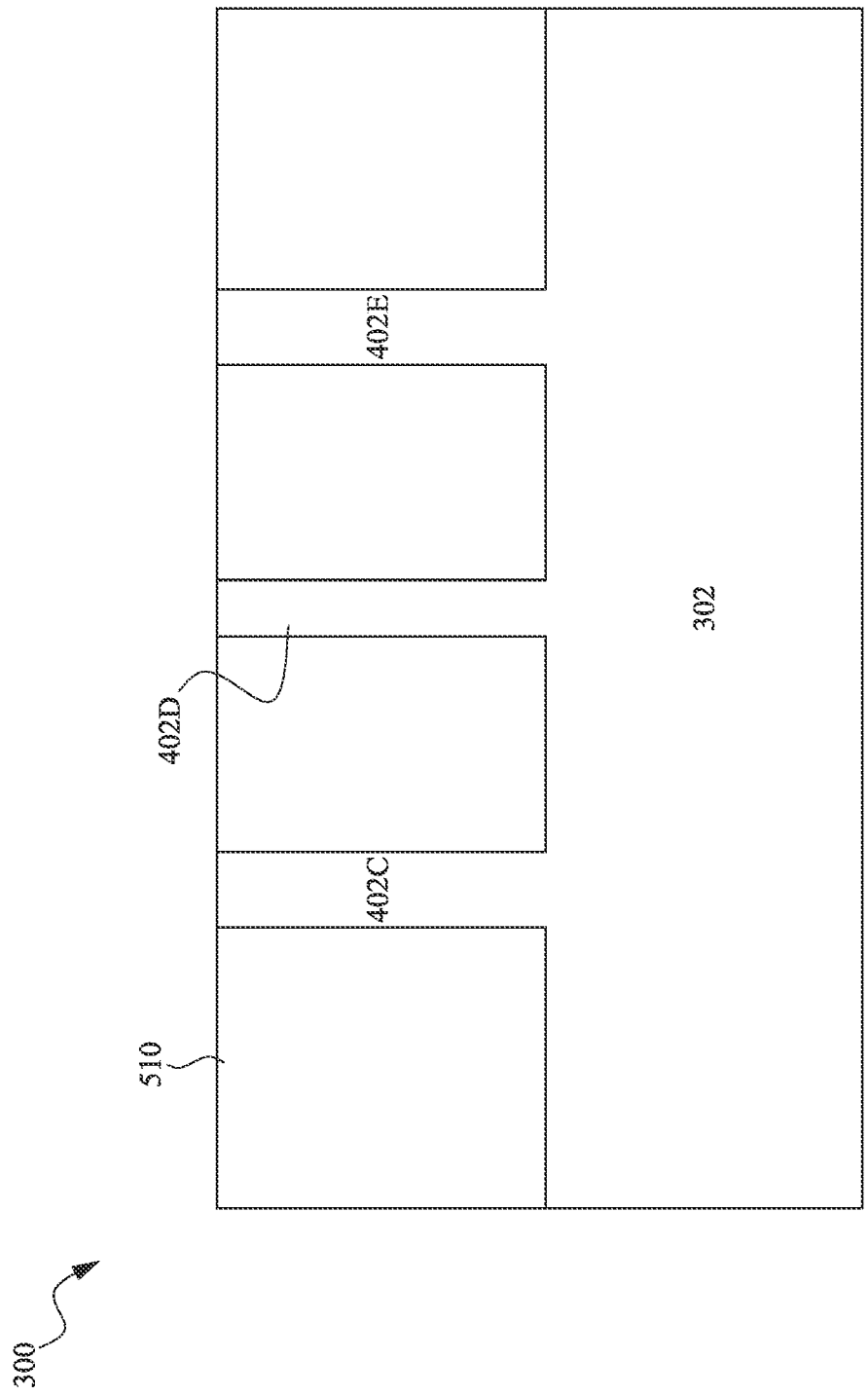

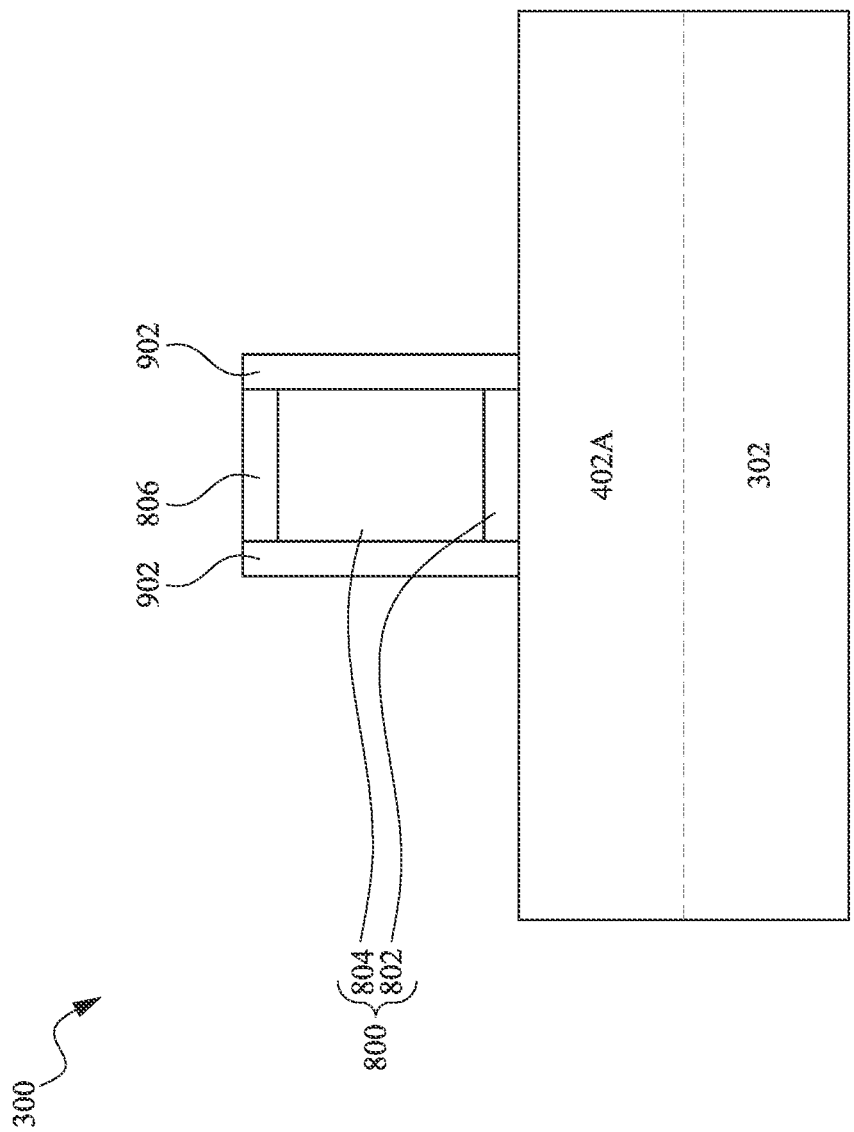

FIN FIELD-EFFECT TRANSISTOR AND METHOD OF FORMING THE SAME

CROSS-REFERENCE TO RELATED APPLICATIONS

This application claims the benefit of and priority to U.S. Provisional Patent App. No. 63/029,018, filed May 22, 2020, the entire disclosure of which is incorporated herein by reference.

BACKGROUND

The present disclosure generally relates to semiconductor devices, and particularly to methods of making a non-planar transistor.

The semiconductor industry has experienced rapid growth due to continuous improvements in the integration density of a variety of electronic components (e.g., transistors, diodes, resistors, capacitors, etc.). For the most part, this improvement in integration density has come from repeated reductions in minimum feature size, which allows more components to be integrated into a given area.

Fin Field-Effect Transistor (FinFET) devices are becoming commonly used in integrated circuits. FinFET devices have a three-dimensional structure that comprises a fin protruding from a substrate. A gate structure, configured to control the flow of charge carriers within a conductive channel of the FinFET device, wraps around the fin. For example, in a tri-gate FinFET device, the gate structure wraps around three sides of the fin, thereby forming conductive channels on three sides of the fin.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 3, 4A, 4B, 5A, 5B, 6A, 6B, 7A, 7B, 8A, 8B, 9, 10, 11, 12A, and 12B illustrate cross-sectional views of an example FinFET device (or a portion of the example FinFET device) during various fabrication stages, made by the method of FIG. 2, in accordance with some embodiments.

DETAILED DESCRIPTION

Figure 1:
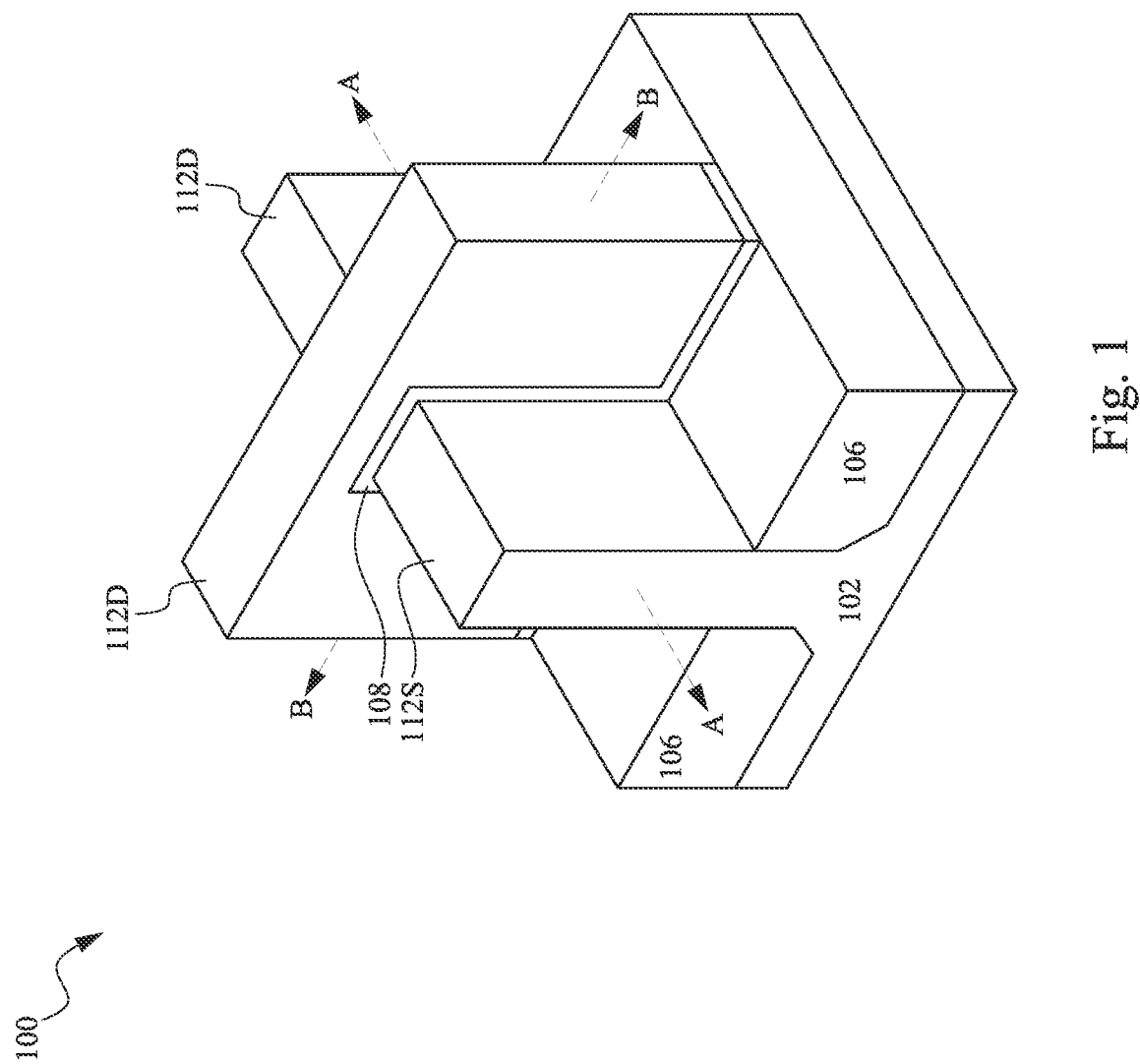
FIG. 1 illustrates a perspective view of a Fin Field-Effect Transistor (FinFET) device, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In general, when forming a FinFET device, a number of fins are formed over a substrate in parallel with one another. Such fins are typically isolated from another by respective portions of an isolation region (e.g., a shallow trench isolation (STI) region). In certain portions of the isolation region (e.g., the portions between two or more relatively close fins) formed by the existing technologies, the isolation region may be formed higher than other portions of the isolation region. As such, one or more of the fins may each have portions of the isolation region disposed on its opposite sides that are not level with each other. Such unlevel portions of the isolation region may cause various issues during the subsequent processing steps. For example, a gate structure, formed over the fin having unlevel portions of the isolation region on its sides, may induce leakage current (e.g., from the gate structure to source/drain structure(s)). Thus, the existing technologies to form FinFET devices are not entirely satisfactory.

The present disclosure provides various embodiments to form a FinFET device that has a number of fins disposed in parallel with one another. In some embodiments, an isolation region separating the number of fins can be formed to have a level surface across different portions (regions) of the isolation region. By forming the isolation region to have a level surface across different portions (e.g., the portion between two relatively close fins and the portion having one side next to a fin), the bottom surface of a gate structure can land on the level surface, which can significantly limit the leakage current observed in the existing technologies. Upon forming such a level surface of the isolation regions, at least respective (e.g., tip) portions of some of the fins can bend toward each other.

FIG. 1 illustrates a perspective view of an example FinFET device 100, in accordance with various embodiments. The FinFET device 100 includes a substrate 102 and a fin 104 protruding above the substrate 102. Isolation regions 106 are formed on opposing sides of the fin 104, with the fin 104 protruding above the isolation regions 106. A gate dielectric 108 is along sidewalls and over a top surface of the fin 104, and a gate 110 is over the gate dielectric 108. Source/drain regions 112S and 112D are in (or extended from) the fin 104 and on opposing sides of the gate dielectric 108 and the gate 110. FIG. 1 is provided as a reference to illustrate a number of cross-sections in subsequent figures. For example, cross-section B-B extends along a longitudinal axis of the gate 110 of the FinFET device 100. Cross-section A-A is perpendicular to cross-section B-B and is along a longitudinal axis of the fin 104 and in a direction of, for example, a current flow between the source/drain regions 112S and 112D. Subsequent figures refer to these reference cross-sections for clarity.

Figure 2:
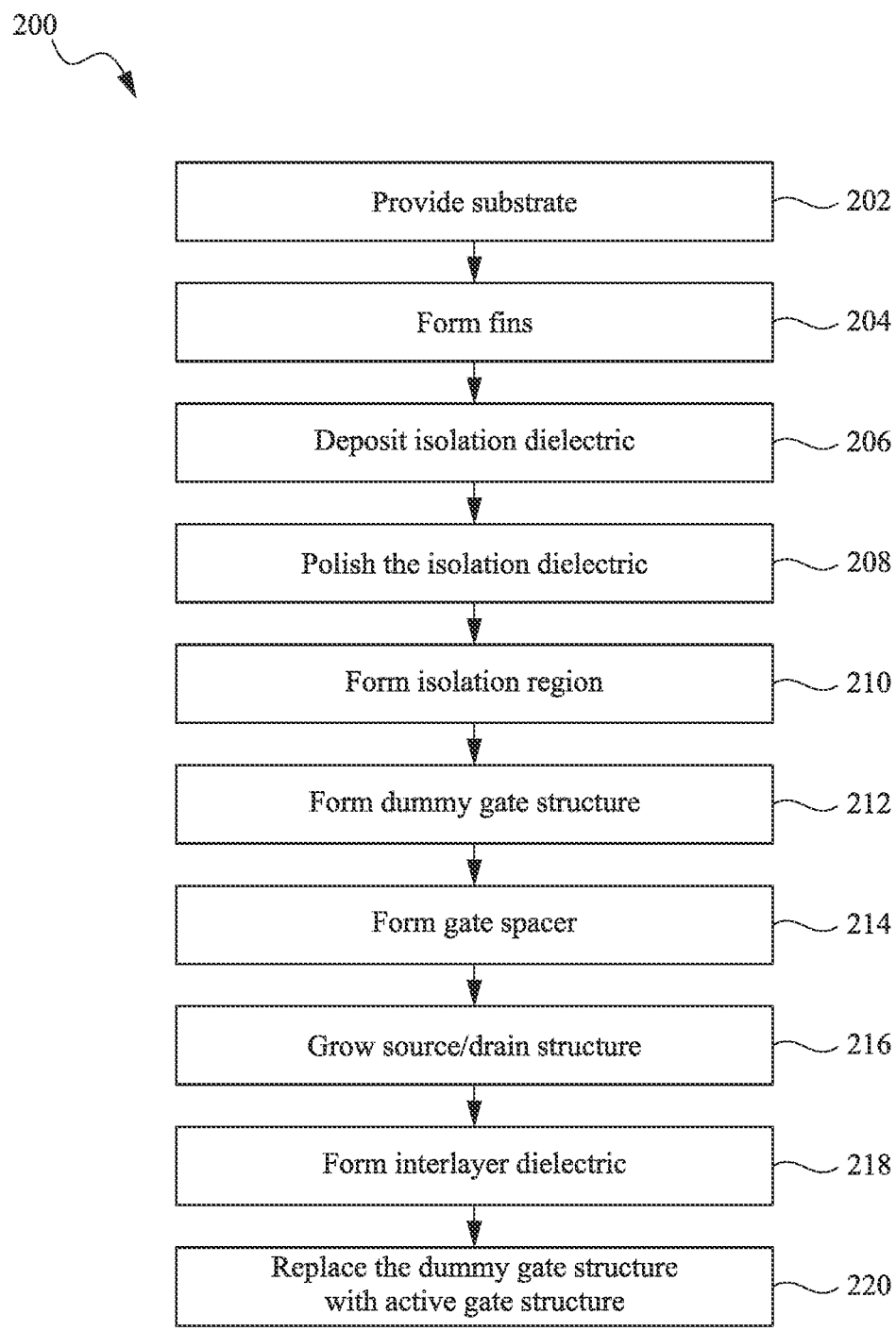
FIG. 2 illustrates a flow chart of an example method for making a non-planar transistor device, in accordance with some embodiments.

FIG. 2 illustrates a flowchart of a method 200 to form a non-planar transistor device, according to one or more embodiments of the present disclosure. For example, at least some of the operations of the method 200 can be used to form a FinFET device (e.g., FinFET device 100), a nanosheet transistor device, a nanowire transistor device, a vertical transistor, or the like. It is noted that the method 200 is merely an example, and is not intended to limit the present disclosure. Accordingly, it is understood that additional operations may be provided before, during, and after the method 200 of FIG. 2, and that some other operations may only be briefly described herein. In some embodiments, operations of the method 200 may be associated with cross-sectional views of an example FinFET device at various fabrication stages as shown in FIGS. 3, 4A, 4B, 5A, 5B, 6A, 6B, 7A, 7B, 8A, 8B, 9, 10, 11, 12A, and 12B, respectively, which will be discussed in further detail below.

In brief overview, the method 200 starts with operation 202 of providing a substrate. The method 200 continues to operation 204 of forming a number of fins. The method 200 continues to operation 206 of depositing an isolation dielectric. The method 200 continues to operation 208 of polishing the isolation dielectric. The method 200 continues to operation 210 of forming an isolation region that has a level surface such that some of the fins bend toward each other. The method 200 continues to operation 212 of forming a dummy gate structure. The method 200 continues to operation 214 of forming a gate spacer. The method 200 continues to operation 216 of growing source/drain structures. The method 200 continues to operation 218 of forming an interlayer dielectric (ILD). The method 200 continues to operation 220 of replacing the dummy gate structure with an active gate structure.

As mentioned above, FIGS. 3-12B each illustrate, in a cross-sectional view, a portion of a FinFET device 300 at various fabrication stages of the method 200 of FIG. 2. The FinFET device 300 is substantially similar to the FinFET device 100 shown in FIG. 1. Although FIGS. 3-12B illustrate the FinFET device 300, it is understood the FinFET device 300 may include a number of other devices such as inductors, fuses, capacitors, coils, etc., which are not shown in FIGS. 3-12B, for purposes of clarity of illustration.

Corresponding to operation 202 of FIG. 2, FIG. 3 is a cross-sectional view of the FinFET device 300 including a semiconductor substrate 302 at one of the various stages of fabrication. The cross-sectional view of FIG. 3 is cut along the lengthwise direction of an active/dummy gate structure of the FinFET device 300 (e.g., cross-section B-B indicated in FIG. 1).

The substrate 302 may be a semiconductor substrate, such as a bulk semiconductor, a semiconductor-on-insulator (SOI) substrate, or the like, which may be doped (e.g., with a p-type or an n-type dopant) or undoped. The substrate 302 may be a wafer, such as a silicon wafer. Generally, an SOI substrate includes a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 302 may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

Figure 4B:
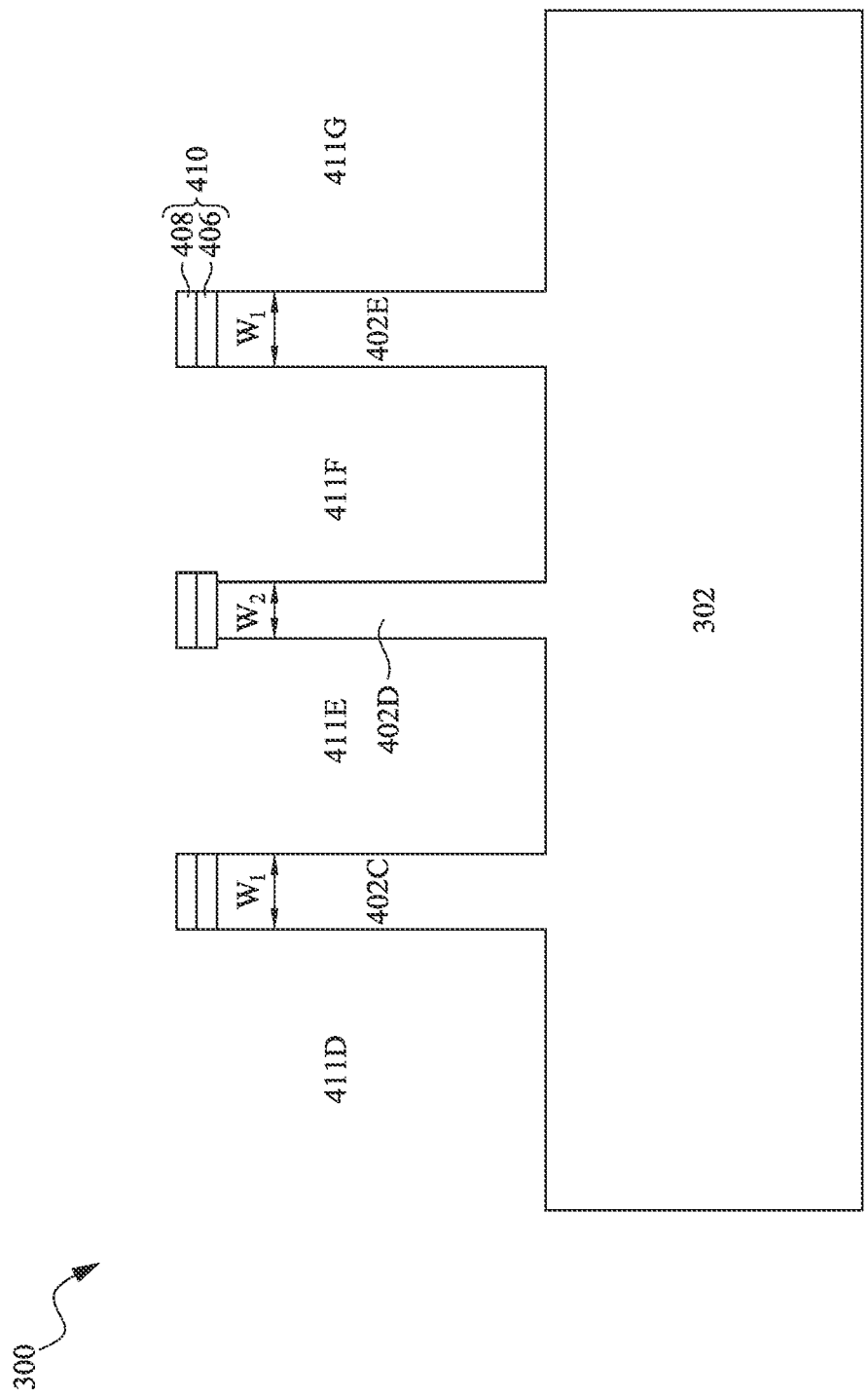

Corresponding to operation 204 of FIG. 2, FIG. 4A is a cross-sectional view of the FinFET device 300 including a number of (semiconductor) fins 402A and 402B at one of the various stages of fabrication. Also corresponding to operation 204, FIG. 4B is a cross-sectional view of the FinFET device 300 including a number of (semiconductor) fins 402C, 402D, and 402E at one of the various stages of fabrication. The cross-sectional view of FIGS. 4A-B are each cut along the lengthwise direction of an active/dummy gate structure of the FinFET device 300 (e.g., cross-section B-B indicated in FIG. 1).

WM Although two fins (402A-B) and three fins (402C-E) are shown in the illustrated embodiments of FIG. 4A-B, respectively, it should be appreciated that the FinFET device 300 can include any number of fins while remaining within the scope of the present disclosure. The fins 402A-E may sometimes be referred to as fin 402 in the following discussions. In some embodiments, the fin 402 is formed by patterning the substrate 302 using, for example, photolithography and etching techniques. For example, a mask layer, such as a pad oxide layer 406 and an overlying pad nitride layer 408, is formed over the substrate 302. The pad oxide layer 406 may be a thin film comprising silicon oxide formed, for example, using a thermal oxidation process. The pad oxide layer 406 may act as an adhesion layer between the substrate 302 and the overlying pad nitride layer 408. In some embodiments, the pad nitride layer 408 is formed of silicon nitride, silicon oxynitride, silicon carbonitride, the like, or combinations thereof. The pad nitride layer 408 may be formed using low-pressure chemical vapor deposition (LPCVD) or plasma enhanced chemical vapor deposition (PECVD), for example.

The mask layer may be patterned using photolithography techniques. Generally, photolithography techniques utilize a photoresist material (not shown) that is deposited, irradiated (exposed), and developed to remove a portion of the photoresist material. The remaining photoresist material protects the underlying material, such as the mask layer in this example, from subsequent processing steps, such as etching. For example, the photoresist material is used to pattern the pad oxide layer 406 and pad nitride layer 408 to form a patterned mask 410, as illustrated in FIGS. 4A-B.

The patterned mask 410 is subsequently used to pattern exposed portions of the substrate 302 to form trenches (or openings) 411A, 411B, 411C, 411D, 411E, 411F, and 411G, thereby defining a fin 402 between adjacent trenches 411 as illustrated in FIGS. 4A-B. When multiple fins are formed, such a trench may be disposed between any adjacent ones of the fins, or next to one of the fins. For example, the trench 411B is disposed between the fins 402A-B; and the trench 411C is disposed next to the fin 402B. The trenches 411A-G may sometimes be referred to as trench(es) 411 in the following discussions. In some embodiments, the fin 402 is formed by etching trenches in the substrate 302 using, for example, reactive ion etch (ME), neutral beam etch (NBE), the like, or combinations thereof. The etch may be anisotropic. In some embodiments, the trenches 411 may be strips (viewed from the top) parallel to each other, and closely spaced with respect to each other. In some embodiments, the trenches 411 may be continuous and surround the fin 402.

The fin 402 may be patterned by any suitable method. For example, the fin 402 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used to pattern the fin.

In some embodiments, when forming the fins 402A-E, one or more of the fins in an inter-fin region (e.g., the regions corresponding to the trenches 411B, 411E, and 411F, respectively) may experience more etching than in or next to an outer-fin region (e.g., the regions corresponding to the trenches 411A, 411C, 411D, and 411G, respectively). Hereinafter, the trenches 411B, 411E, and 411F may sometimes be referred to as inter-fin regions 411B, 411E, and 411F, respectively; and the trenches 411A, 411C, 411D, and 411G may sometimes be referred to as outer-fin regions 411A, 411C, 411D, and 411G, respectively. This may be because the inter-fin region have a less amount of silicon while forming the fins. As such, the fin in such an inter-fin region may be trimmed to have a narrower width. For example in FIG. 4B, the fins 402C and 402E that are next to the outer-fin regions 411D and 411G may have a width, $W_1$, and the fin 402D in the inter-fin regions 411E-F may have a width, $W_2$, wherein $W_2$ is less than $W_1$. Depending on how wide the inter-fin regions 411E-F are, $W_2$ may have a certain ratio to $W_1$.

Corresponding to operation 206 of FIG. 2, FIG. 5A is a cross-sectional view of the FinFET device 300 including an isolation dielectric 500 overlaying the fins 402A-B at one of the various stages of fabrication. Also corresponding to operation 206, FIG. 5B is a cross-sectional view of the FinFET device 300 including the isolation dielectric 510 overlaying the fins 402C-E at one of the various stages of fabrication. The cross-sectional views of FIG. 5A-B are each cut along the lengthwise direction of an active/dummy gate structure of the FinFET device 300 (e.g., cross-section B-B indicated in FIG. 1).

The isolation dielectrics 500 and 510 may each be an oxide, such as silicon oxide, a nitride, the like, or combinations thereof, and may be formed by a high density plasma chemical vapor deposition (HDP-CVD), a flowable CVD (FCVD) (e.g., a CVD-based material deposition in a remote plasma system and post curing to make it convert to another material, such as an oxide), the like, or combinations thereof. Other isolation dielectrics and/or other formation processes may be used. In an example, the isolation dielectrics 500 and 510 is each silicon oxide formed by a FCVD process. An anneal process may be performed once the isolation dielectrics 500 and 510 are formed.

In some embodiments, the isolation dielectrics 500 and 510 may each include a liner, e.g., a liner oxide (not shown), at the interface between the isolation dielectric 500/510 and the substrate 302 (fins 402). In some embodiments, the liner oxide is formed to reduce crystalline defects at the interface between the substrate 302 and the isolation dielectric 500/510. Similarly, the liner oxide may also be used to reduce crystalline defects at the interface between the fins 402 and the isolation dielectric 500/510. The liner oxide (e.g., silicon oxide) may be a thermal oxide formed through a thermal oxidation of a surface layer of the substrate 302, although other suitable method may also be used to form the liner oxide.

Corresponding to operation 208 of FIG. 2, FIG. 6A is a cross-sectional view of the FinFET device 300 in which the isolation dielectric 500 overlaying the fins 402A-B is polished at one of the various stages of fabrication. Also corresponding to operation 208, FIG. 6B is a cross-sectional view of the FinFET device 300 in which the isolation dielectric 510 overlaying the fins 402C-E is polished at one of the various stages of fabrication. The cross-sectional view of FIGS. 6A-B are each cut along the lengthwise direction of an active/dummy gate structure of the FinFET device 300 (e.g., cross-section B-B indicated in FIG. 1).

A chemical mechanical polish (CMP) process may be performed to polish (e.g., remove) any excess isolation dielectric and form top surfaces of the isolation dielectric 500/510 and respective top surfaces of the fins 402A-E that are coplanar, as shown in FIGS. 6A-B. In some embodiments, the patterned mask 410 may be removed by the planarization process. In some embodiments, the patterned mask 410 may remain after the planarization process. For clarity of illustration, the patterned mask 410 is not shown in FIG. 6A or 6B.

Figure 7A:
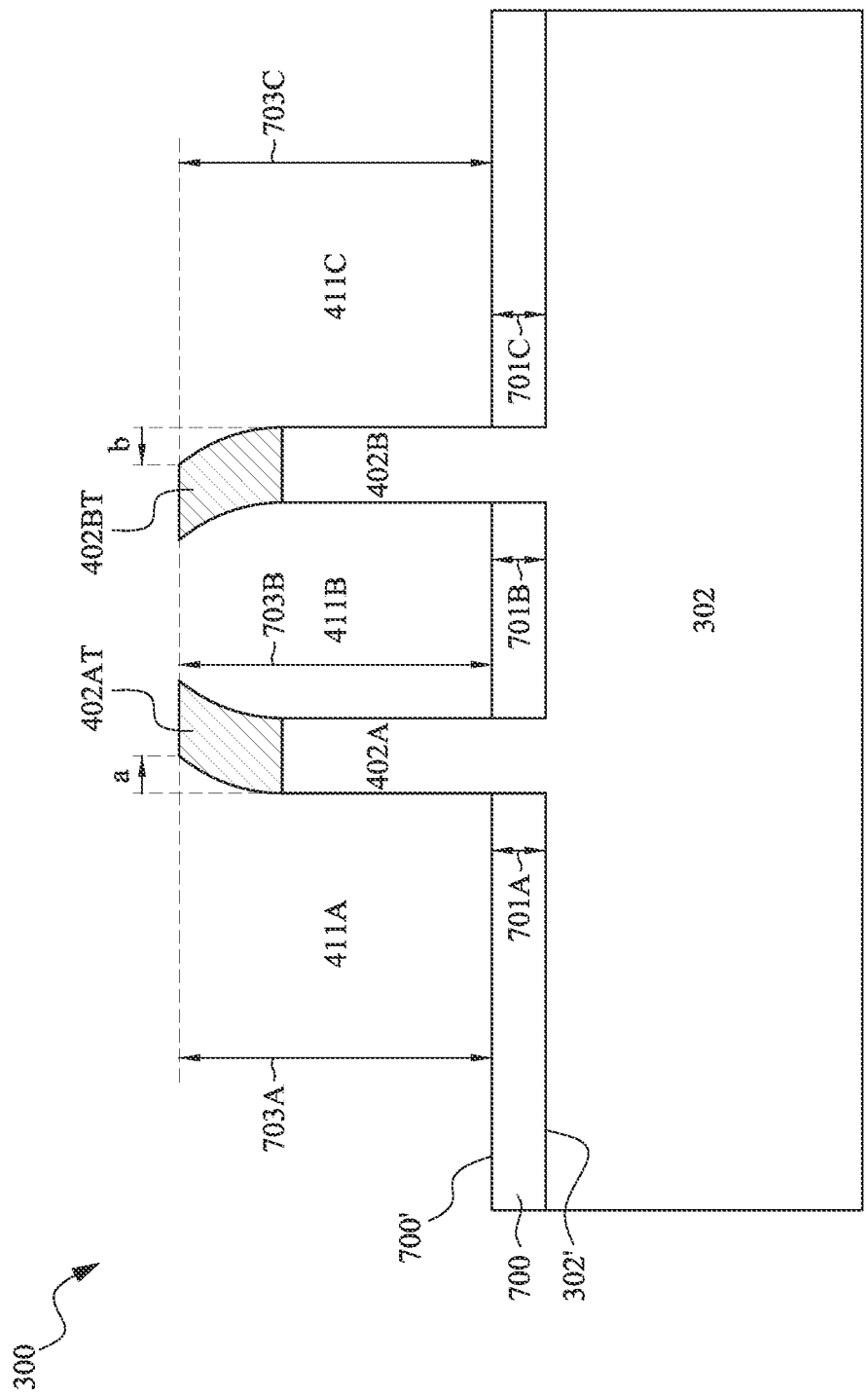
Figure 7B:
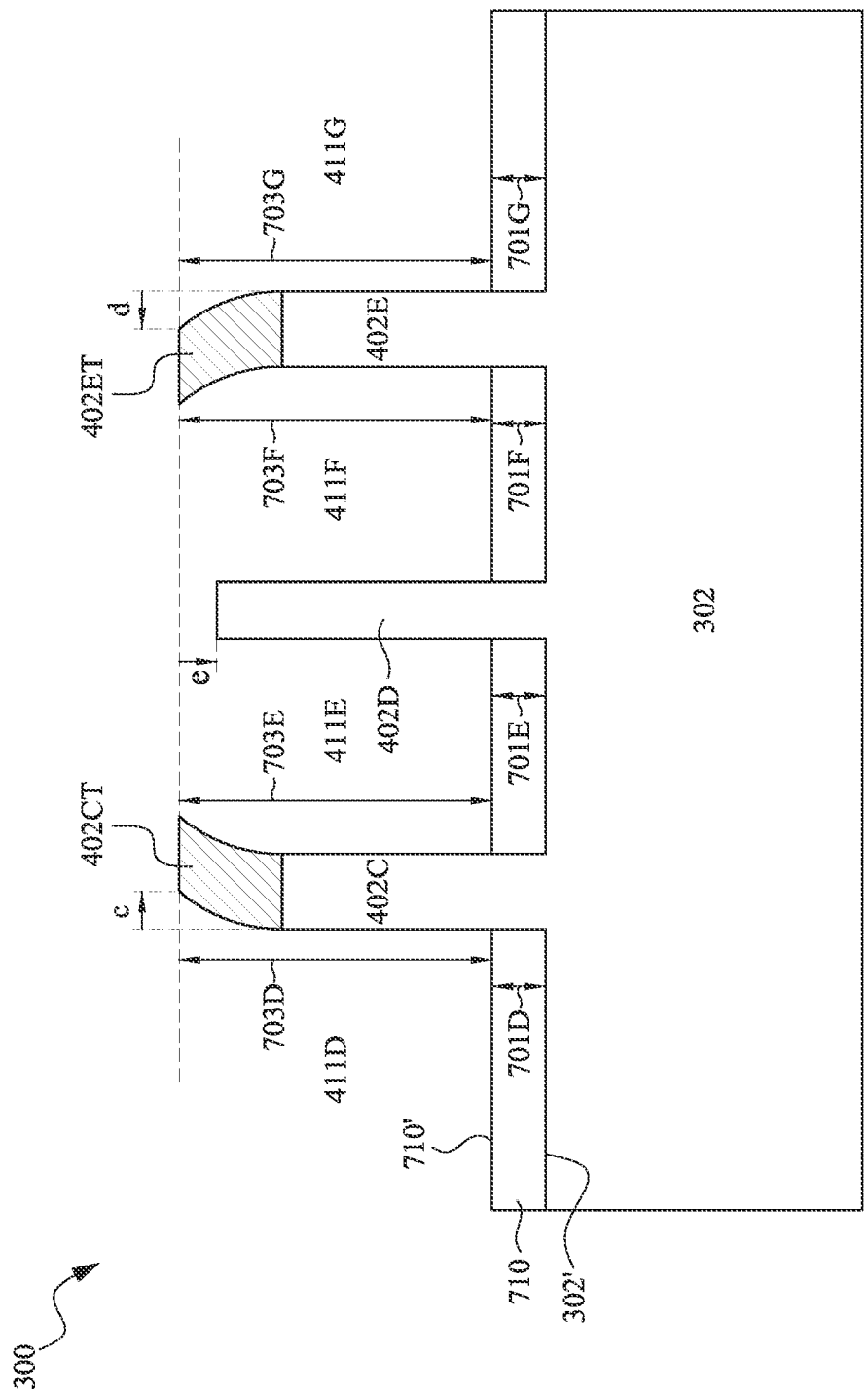

Corresponding to operation 210 of FIG. 2, FIG. 7A is a cross-sectional view of the FinFET device 300 including an isolation region 700 that has a level surface across the inter-fin regions and outer-fin regions 411A-C at one of the various stages of fabrication. Also corresponding to operation 210, FIG. 7B is a cross-sectional view of the FinFET device 300 including an isolation region 710 that has a level surface across the inter-fin regions and outer-fin regions 411D-G at one of the various stages of fabrication. The cross-sectional view of FIGS. 7A-B are each cut along the lengthwise direction of an active/dummy gate structure of the FinFET device 300 (e.g., cross-section B-B indicated in FIG. 1).

The isolation region 700 is formed by recessing the isolation dielectric 500 (FIG. 6A); and the isolation region 710 is formed by recessing the isolation dielectric 510 (FIG. 6B). The isolation regions 700 and 710 are sometimes referred to as shallow trench isolation (STI) regions. The isolation dielectric 500/510 is recessed such that upper portions of the fins 402A-E protrude from between neighboring isolation regions 700/710. In other words, lower portions of the fins 402A-E are embedded or otherwise overlaid by the isolation regions 700/710. A top surface 700' of the isolation region 700 and a top surface 710' of the isolation region 710 may have a flat surface (as illustrated in FIGS. 7A and 7B), a convex surface, a concave surface (such as dishing), or combinations thereof. The top surfaces 700' and 710' of the isolation regions 700 and 710 may be formed flat, convex, and/or concave by an appropriate etch. The isolation regions 700 and 710 may be recessed using an acceptable etching process, such as one that is selective to the material of the isolation dielectric 500/510. For example, a dry etch using an etchant gas (based on the gas sources, e.g., chlorine ($Cl_2$), hydrogen bromide (HBr), carbon tetrafluoride ($CF_4$), fluoroform ($CHF_3$), difluoromethane ($CH_2F_2$), fluoromethane ($CH_3F$), hexafluoro-1,3-butadiene ($C_4F_6$), boron trichloride ($BCl_3$), sulfur hexafluoride ($SF_6$), hydrogen ($H_2$), nitrogen trifluoride ($NF_3$)) or a wet etch using dilute hydrofluoric (DHF) acid may be performed to recess the isolation regions 700 and 710.

In accordance with various embodiments, by controlling the etching process, the top surface 700' and 710' of the isolation regions 700 and 710 are formed to be level or coplanar across one or more inter-fin regions and outer-fin regions. As illustrated in FIG. 7A, the top surface 700' of the isolation region 700 is substantially flat across the inter-fin and outer-fin regions 411A-C; and as illustrated in FIG. 7B, the top surface 710' of the isolation region 710 is substantially flat across the inter-fin and outer-fin regions 411D-G. For example, a depth 701A vertically measured from top surface 302' of the substrate 302 to the top surface 700' in the outer-fin region 411A, a depth 701B vertically measured from the top surface 302' to the top surface 700' in the inter-fin region 411B, and a depth 701C vertically measured from the top surface 302' to the top surface 700' in the outer-fin region 411C are almost equal to one another, or present a difference with respect to one another that is less than 5%. In another example, a depth 701D vertically measured from the top surface 302' to the top surface 710' in the outer-fin region 411D, a depth 701E vertically measured from the top surface 302' to the top surface 710' in the inter-fin region 411E, a depth 701F vertically measured from the top surface 302' to the top surface 710' in the inter-fin region 411F, and a depth 701G vertically measured from the top surface 302' to the top surface 710' in the outer-fin region 411G are almost equal to one another, or present a difference with respect to one another that is less than 5%.

To form such a level top surface of the isolation region, stress induced around the isolation regions in the inter-fin region(s) may cause the fins next to the inter-fin region(s) to bend. For example, the fin that experiences the stress on one of its sides may be bent (or tilted). At least a tip portion of the fin may be bent toward the side where the stress is induced. For example in FIG. 7A, stress may be induced in isolation region 700 in the inter-fin region 411B, which can cause at least tip portion 402AT of the fin 402A and tip portion 402BT of the fin 402B to bend toward the inter-fin region 411B with non-zero lateral shift distances, "a" and "b," respectively. As such, the bent tip portions 402AT and 402BT (e.g., with a vertical height of about 45~65 nm), which constitute about 10%~30% of a vertical height of the fins 402A and 402B, can point to each other. In a non-limiting example, the distances a and b may be each greater than 0 nm and less than 10 nm. In some embodiments, the remaining portion of each of the fins 402A-B may not be bent, e.g., remain perpendicular to the top surface 302' of the substrate, or may be bent less, e.g., with less lateral shift distances or being inclined.

As such, a spacing (along the cross-section) between the tip portions 402AT and 402BT to be less than a spacing (along the cross-section) between the respective remaining portions of the fins 402A-B. Another way to calibrate the level top surface 700' may rely on a height measured from a top surface of the tip portions to the level top surface 700' in each of the inter-fin and outer-fin regions. For example, in the outer-fin region 411A, a height 703A measured from a lateral projection of the top surface of the tip portions to the top surface 700', a height 703B measured from the lateral projection of the top surface of the tip portions to the top surface 700', and a height 703C measured from the lateral projection of the top surface of the tip portions to the top surface 700' are almost equal to one another, or present a difference with respect to one another that is less than 5%.

In another example shown in FIG. 7B, stress may be induced in the isolation region 710 in the inter-fin regions 411E-F, which can cause at least tip portion 402CT of the fin 402C and the tip portion 402ET of the fin 402E to bend toward the inter-fin regions 411E and 411F with non-zero lateral shift distances, "c" and "d," respectively. As such, the bent tip portions 402CT and 402ET (e.g., with a vertical height of about 45~65 nm), which constitute about 10%~30% of a vertical height of the fins 402C and 402E, can point to each other (or toward the fin 402D disposed between the fins 402C and 402E). In a non-limiting example, the distances c and d may be each greater than 0 nm and less than 10 nm. In some embodiments, the remaining portion of each of the fins 402C and 402E may not be bent, e.g., remain perpendicular to the top surface 302' of the substrate, or may be bent less, e.g., with less lateral shift distances. As such, a spacing (along the cross-section) between the tip portions 402CT and 402ET to be less than a spacing (along the cross-section) between the respective remaining portions of the fins 402C and 402E.

Similarly as calibrating the level top surface 700', whether the top surface 710' is level may be calibrated based on a height measured from a top surface of the tip portions to the level top surface 710' in each of the inter-fin and outer-fin regions. For example, in the outer-fin region 411D, a height 703D measured from a lateral projection of the top surface of the tip portions to the top surface 710', a height 703E measured from the lateral projection of the top surface of the tip portions to the top surface 710', a height 703F measured from the lateral projection of the top surface of the tip portions to the top surface 710', and a height 703G measured from the lateral projection of the top surface of the tip portions to the top surface 710' are almost equal to one another, or present a difference with respect to one another that is less than 5%. Further, one or more of the fins that are sandwiched between the isolation regions (e.g., in the inter-fin regions) where stress is induced can be pulled down to have a shorter height. For example in FIG. 7B, the fin 402D that are sandwiched by the isolation region 710 in the inter-fin regions 411E and 411F may become shorter than the fins 402C and 402E, by a vertical distance, "e."

Figure 8A:
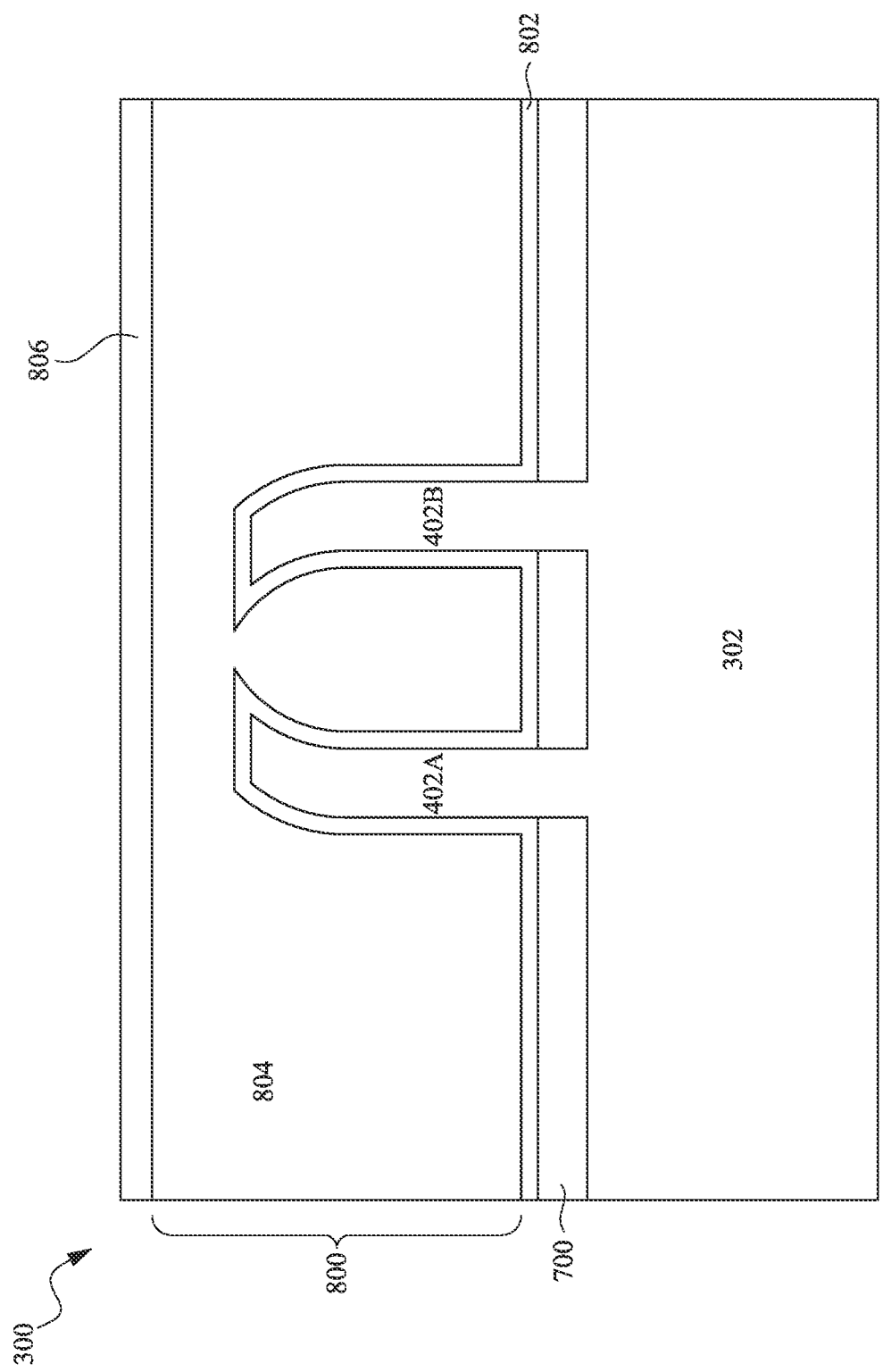
Figure 8B:
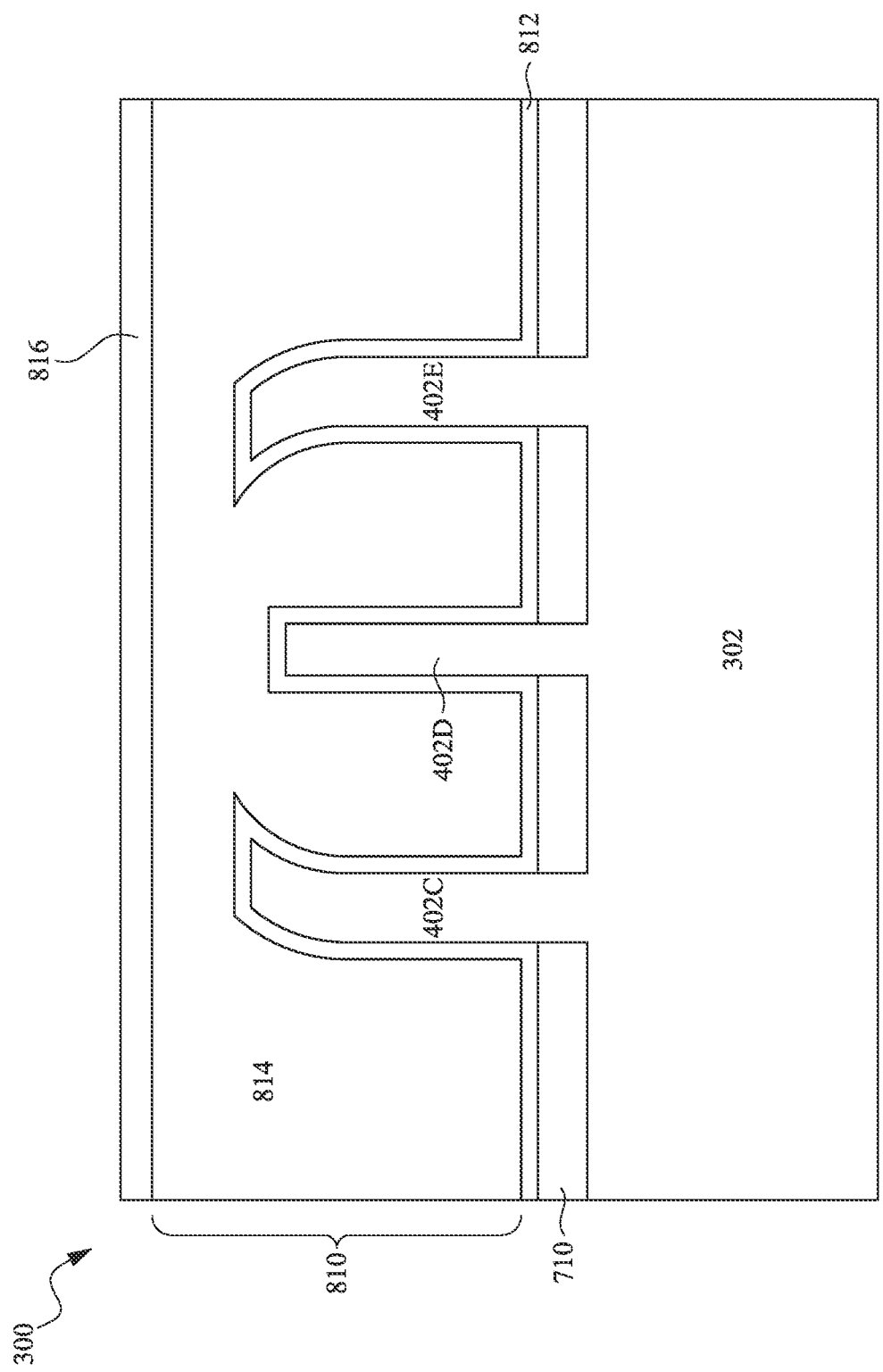

Corresponding to operation 212 of FIG. 2, FIG. 8A is a cross-sectional view of the FinFET device 300 including a dummy gate structure 800 at one of the various stages of fabrication. Also corresponding to operation 212, FIG. 8B is a cross-sectional view of the FinFET device 300 including a dummy gate structure 810 at one of the various stages of fabrication. The cross-sectional view of FIGS. 8A-B are each cut along the lengthwise direction of an active/dummy gate structure of the FinFET device 300 (e.g., cross-section B-B indicated in FIG. 1).

The dummy gate structure 800 includes a dummy gate dielectric 802 and a dummy gate 804; and the dummy gate structure 810 includes a dummy gate dielectric 812 and a dummy gate 814, in some embodiments. A mask 806 may be formed over the dummy gate structure 800; and a mask 816 may be formed over the dummy gate structure 810. To form the dummy gate structure 800/810, a dielectric layer is formed on the fins 402A-B and/or 402C-E. The dielectric layer may be, for example, silicon oxide, silicon nitride, silicon oxynitride, silicon carbide, silicon carbonitride, silicon oxycarbonitride, silicon oxycarbide, multilayers thereof, or the like, and may be deposited or thermally grown.

A gate layer is formed over the dielectric layer, and a mask layer is formed over the gate layer. The gate layer may be deposited over the dielectric layer and then planarized, such as by a CMP. The mask layer may be deposited over the gate layer. The gate layer may be formed of, for example, polysilicon, although other materials may also be used. The mask layer may be formed of, for example, silicon nitride or the like.

After the layers (e.g., the dielectric layer, the gate layer, and the mask layer) are formed, the mask layer may be patterned using suitable lithography and etching techniques to form the mask 806/816. The pattern of the mask 806/816 then may be transferred to the gate layer and the dielectric layer by a suitable etching technique to form the dummy gate 804/814 and the underlying dummy gate dielectric 802/812, respectively. The dummy gate 804/814 and the dummy gate dielectric 802/812 straddle or otherwise cover a respective portion (e.g., a channel region) of each of the fins 402A-E. For example, when one dummy gate structure is formed, a dummy gate and dummy gate dielectric of the dummy gate structure may straddle respective central portions of the fins. The dummy gate 804/814 may also have a lengthwise direction (e.g., cross-section B-B of FIG. 1) perpendicular to the lengthwise direction (e.g., cross-section A-A of FIG. 1) of the fins.

Figure 10:
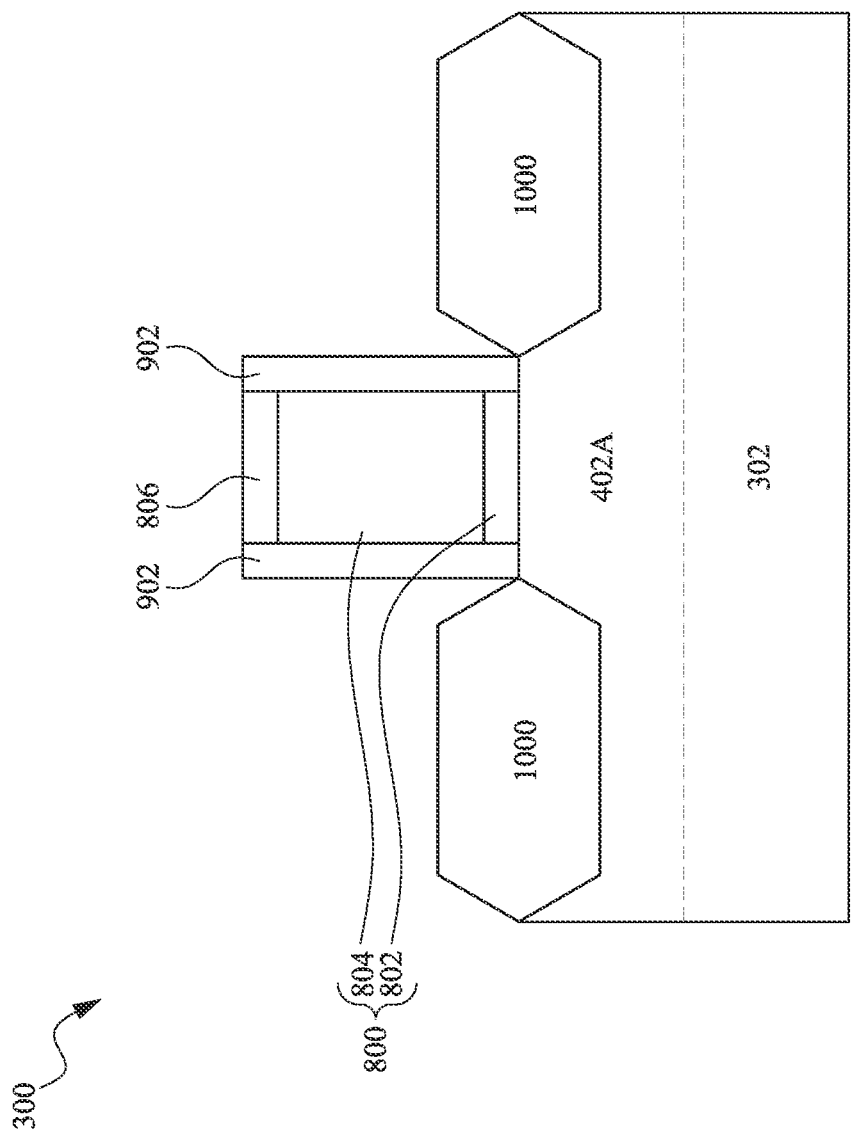
Figure 11:
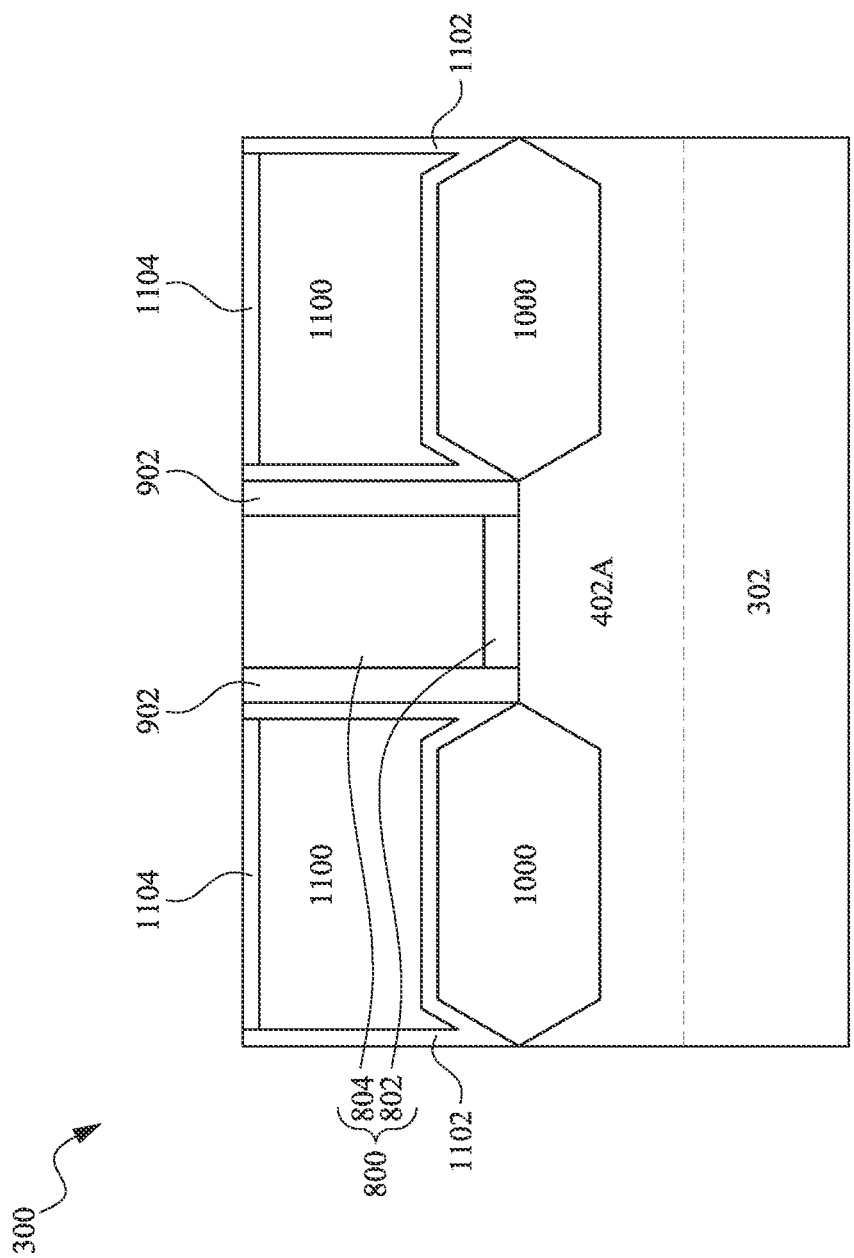

FIGS. 9-11 illustrate the cross-sectional views of further processing (or making) of the FinFET device 300 along the lengthwise direction (e.g., cross-section A-A indicated in FIG. 1) of one of the fins 402A-E. As a representative example, one dummy gate structure (e.g., 800) is illustrated over the fin 402A in FIGS. 9-11. It should be appreciated that more or less than one dummy gate structure can be formed over the fin 402A (and each of the other fins), while remaining within the scope of the present disclosure.

Corresponding to operation 214 of FIG. 2, FIG. 9 is a cross-sectional view of the FinFET device 300 including a gate spacer 902 formed around (e.g., along and contacting the sidewalls of) the dummy gate structure 800. The cross-sectional view of FIG. 9 is cut along the lengthwise direction of the fin 402A (e.g., cross-section A-A indicated in FIG. 1).

For example, the gate spacer 902 may be formed on opposing sidewalls of the dummy gate structure 800. Although the gate spacer 902 is shown as a single layer in the example of FIG. 9 (and the following figures), it should be understood that the gate spacer can be formed to have any number of layers while remaining within the scope of the present disclosure. The gate spacer 902 may be a low-k spacer and may be formed of a suitable dielectric material, such as silicon oxide, silicon oxycarbonitride, or the like. Any suitable deposition method, such as thermal oxidation, chemical vapor deposition (CVD), or the like, may be used to form the gate spacer 902. The shapes and formation methods of the gate spacer 902 as illustrated in FIG. 9 are merely non-limiting examples, and other shapes and formation methods are possible. These and other variations are fully intended to be included within the scope of the present disclosure.

Corresponding to operation 216 of FIG. 2, FIG. 10 is a cross-sectional view of the FinFET device 300 including a number (e.g., 2) of source/drain structures 1000 at one of the various stages of fabrication. The cross-sectional view of FIG. 10 is cut along the lengthwise direction of the fin 402A (e.g., cross-section A-A indicated in FIG. 1).

The source/drain structures 1000 are formed in recesses of the fin 402A adjacent to the dummy gate structure 800, e.g., between adjacent dummy gate structures and/or next to a dummy gate structure. The recesses are formed by, e.g., an anisotropic etching process using the dummy gate structure 800 as an etching mask, in some embodiments, although any other suitable etching process may also be used.

The source/drain structures 1000 are formed by epitaxially growing a semiconductor material in the recess, using suitable methods such as metal-organic CVD (MOCVD), molecular beam epitaxy (MBE), liquid phase epitaxy (LPE), vapor phase epitaxy (VPE), selective epitaxial growth (SEG), the like, or a combination thereof.

As illustrated in FIG. 10, the epitaxial source/drain structures 1000 may have surfaces raised from the top surface of the fin 402A (e.g. raised above the non-recessed portions of the fin 402A) and may have facets. In some embodiments, the source/drain structures of the adjacent fins may merge to form a continuous epitaxial source/drain region (not shown). In some embodiments, the source/drain structures of the adjacent fins may not merge together and remain separate source/drain structures (not shown). In some embodiments, when the resulting FinFET device is an n-type FinFET, the source/drain structures 1000 can include silicon carbide (SiC), silicon phosphorous (SiP), phosphorous-doped silicon carbon (SiCP), or the like. In some embodiments, when the resulting FinFET device is a p-type FinFET, the source/drain structures 1000 can include SiGe, and a p-type impurity such as boron or indium.

The epitaxial source/drain structures 1000 may be implanted with dopants to form source/drain structures 1000 followed by an annealing process. The implanting process may include forming and patterning masks such as a photoresist to cover the regions of the FinFET device 300 that are to be protected from the implanting process. The source/drain structures 1000 may have an impurity (e.g., dopant) concentration in a range from about $1\times10^{19}$ cm$^{-3}$ to about $1\times10^{21}$ cm$^{-3}$. P-type impurities, such as boron or indium, may be implanted in the source/drain structures 1000 of a P-type transistor. N-type impurities, such as phosphorous or arsenide, may be implanted in the source/drain structures 1000 of an N-type transistor. In some embodiments, the epitaxial source/drain structures 1000 may be in situ doped during their growth.

Corresponding to operation 218 of FIG. 2, FIG. 11 is a cross-sectional view of the FinFET device 300 including an interlayer dielectric (ILD) 1100 at one of the various stages of fabrication. The cross-sectional view of FIG. 11 is cut along the lengthwise direction of the fin 402A (e.g., cross-section A-A indicated in FIG. 1).

In some embodiments, prior to forming the ILD 1100, a contact etch stop layer (CESL) 1102 is formed over the structure, as illustrated in FIG. 11. The CESL 1102 can function as an etch stop layer in a subsequent etching process, and may comprise a suitable material such as silicon oxide, silicon nitride, silicon oxynitride, combinations thereof, or the like, and may be formed by a suitable formation method such as CVD, PVD, combinations thereof, or the like.

Next, the ILD 1100 is formed over the CESL 1102 and over the dummy gate structure 800. In some embodiments, the ILD 1100 is formed of a dielectric material such as silicon oxide, phosphosilicate glass (PSG), borosilicate glass (BSG), boron-doped phosphosilicate Glass (BPSG), undoped silicate glass (USG), or the like, and may be deposited by any suitable method, such as CVD, PECVD, or FCVD. After the ILD 1100 is formed, an optional dielectric layer 1104 is formed over the ILD 1100. The dielectric layer 1104 can function as a protection layer to prevent or reduces the loss of the ILD 1100 in subsequent etching processes. The dielectric layer 1104 may be formed of a suitable material, such as silicon nitride, silicon carbonitride, or the like, using a suitable method such as CVD, PECVD, or FCVD. After the dielectric layer 1104 is formed, a planarization process, such as a CMP process, may be performed to achieve a level upper surface for the dielectric layer 1104. The CMP may also remove the mask 806 (FIG. 10) and portions of the CESL 1102 disposed over the dummy gate 804. After the planarization process, the upper surface of the dielectric layer 1104 is level with the upper surface of the dummy gate 804, in some embodiments.

Figure 12A:
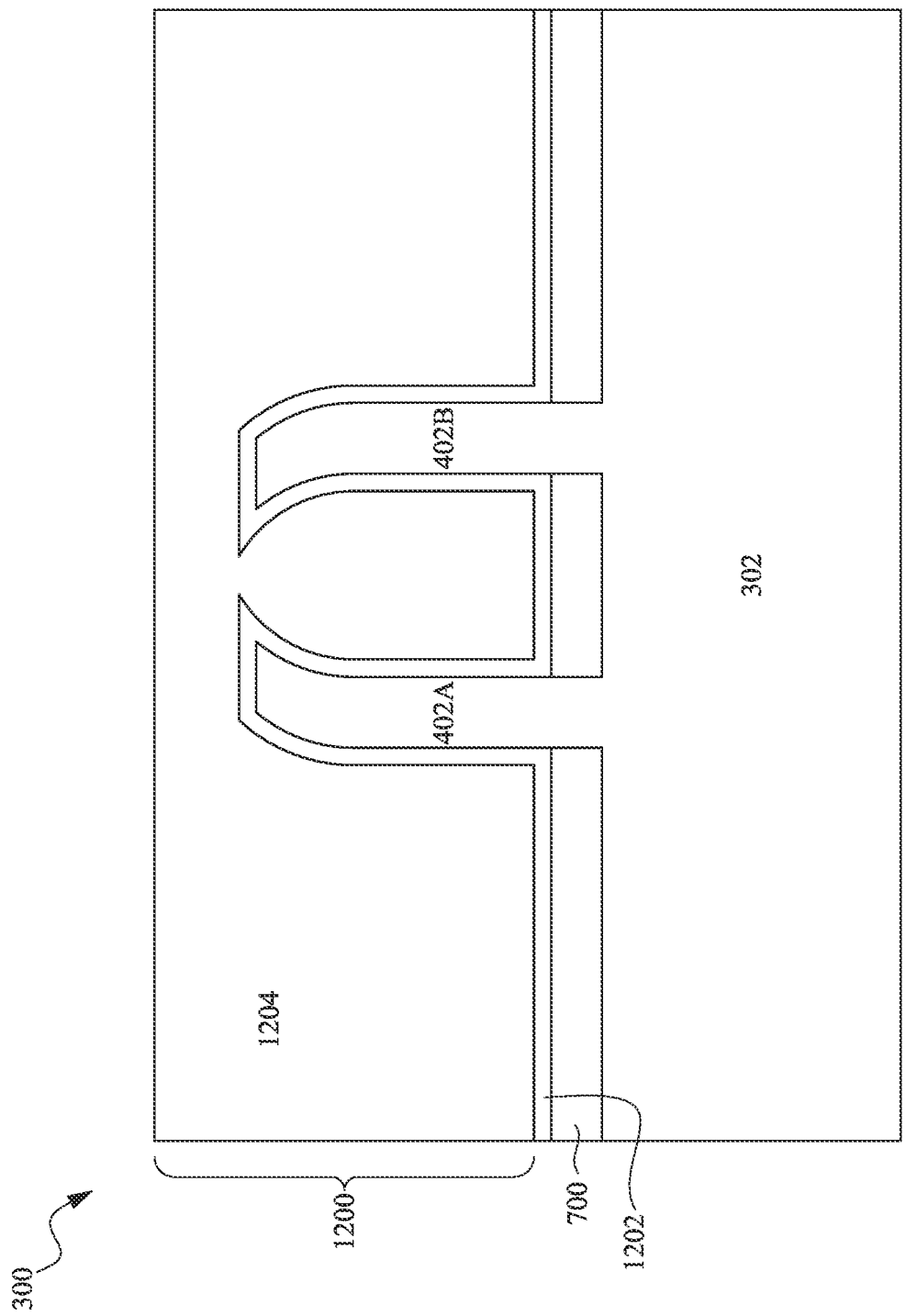
Figure 12B:
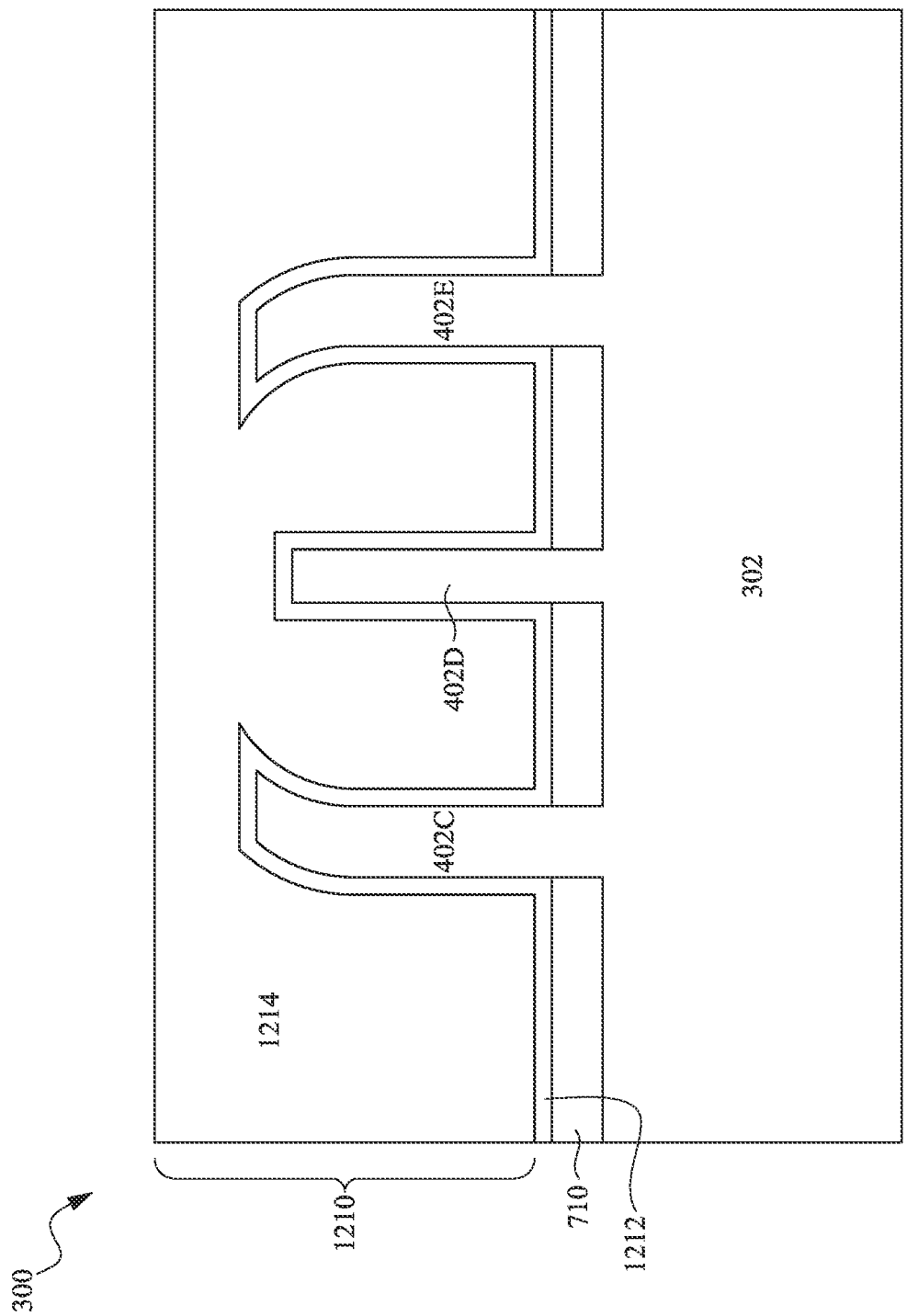

Corresponding to operation 220 of FIG. 2, FIG. 12A is a cross-sectional view of the FinFET device 300 including an active gate structure 1200 at one of the various stages of fabrication. Also corresponding to operation 220, FIG. 12B is a cross-sectional view of the FinFET device 300 including an active gate structure 1210 at one of the various stages of fabrication. The cross-sectional view of FIGS. 12A-B are each cut along a lengthwise direction of the active gate structure 1200/1210 (e.g., cross-section B-B indicated in FIG. 1).

The active gate structure 1200 may be formed by replacing the dummy gate structure 800 (FIG. 8A); and the active gate structure 1210 may be formed by replacing the dummy gate structure 810 (FIG. 8B). The active gate structure 1200 can include a gate dielectric layer 1202, a metal gate layer 1204, and one or more other layers (e.g., a capping layer, a glue layer) that are not shown for clarity; and the active gate structure 1210 can include a gate dielectric layer 1212, a metal gate layer 1214, and one or more other layers (e.g., a capping layer, a glue layer) that are not shown for clarity.

The gate dielectric layer 1202/1212 is deposited (e.g., conformally) in a corresponding gate trench to surround (e.g., straddle) one or more fins. For example, the gate dielectric layer 1202 is deposited in a gate trench that is formed by removing the dummy gate structure 800; and the gate dielectric layer 1212 is deposited in a gate trench that is formed by removing the dummy gate structure 810. The gate dielectric layer 1202 can overlay the respective top surfaces and sidewalls of the fins 402A-B; and the gate dielectric layer 1212 can overlay the respective top surfaces and sidewalls of the fins 402C-E.

The gate dielectric layer 1202/1212 includes silicon oxide, silicon nitride, or multilayers thereof. In example embodiments, the gate dielectric layer 1202/1212 includes a high-k dielectric material, and in these embodiments, the gate dielectric layer 1202/1212 may have a k value greater than about 7.0, and may include a metal oxide or a silicate of Hf, Al, Zr, La, Mg, Ba, Ti, Pb, or combinations thereof. The formation methods of gate dielectric layer 1202/1212 may include molecular beam deposition (MBD), atomic layer deposition (ALD), PECVD, and the like. A thickness of the gate dielectric layer 1202/1212 may be between about 8 angstroms (Å) and about 20 Å, as an example.

The metal gate layer 1204/1214 is formed over the respective gate dielectric layer 1202/1212. The metal gate layer 1204/1214 may be a P-type work function layer, an N-type work function layer, multi-layers thereof, or combinations thereof, in some embodiments. Accordingly, the metal gate layer 1204/1214 is sometimes referred to as a work function layer. For example, the metal gate layer 1204/1214 may be an N-type work function layer. In the discussion herein, a work function layer may also be referred to as a work function metal. Example P-type work function metals that may be included in the gate structures for P-type devices include TiN, TaN, Ru, Mo, Al, WN, $ZrSi_2$, $MoSi_2$, $TaSi_2$, $NiSi_2$, WN, other suitable P-type work function materials, or combinations thereof. Example N-type work function metals that may be included in the gate structures for N-type devices include Ti, Ag, TaAl, TaAlC, TiAlN, TaC, TaCN, TaSiN, Mn, Zr, other suitable N-type work function materials, or combinations thereof.

A work function value is associated with the material composition of the work function layer, and thus, the material of the work function layer is chosen to tune its work function value so that a target threshold voltage $V_t$ is achieved in the device that is to be formed. The work function layer(s) may be deposited by CVD, physical vapor deposition (PVD), ALD, and/or other suitable process. The thickness of a P-type work function layer may be between about 8 Å and about 15 Å, and the thickness of an N-type work function layer may be between about 15 Å and about 30 Å, as an example.

In one aspect of the present disclosure, a semiconductor device is disclosed. The semiconductor device includes a first semiconductor fin that is formed over a substrate and extends along a first lateral axis. The semiconductor device includes a second semiconductor fin that is also formed over the substrate and extends along the first lateral axis. At least a tip portion of the first semiconductor fin and at least a tip portion of the second semiconductor fin bend toward each other along a second lateral axis that is perpendicular to the first lateral axis.

In another aspect of the present disclosure, a semiconductor device is disclosed. The semiconductor device includes a first semiconductor fin that is formed over a substrate and extends along a first lateral axis. The semiconductor device includes a second semiconductor fin that is also formed over the substrate and extends along the first lateral axis. The semiconductor device includes a third semiconductor fin that is also formed over the substrate and extends along the first lateral axis. The third semiconductor fin is disposed between the first and second semiconductor fins. The semiconductor device includes an isolation region that is disposed over the substrate and overlays a lower portion of the first semiconductor fin, a lower portion of the second semiconductor fin, and a lower portion of the third semiconductor fin. At least a tip portion of the first semiconductor fin is tilted toward the third semiconductor fin, and at least a tip portion of the second semiconductor fin is tilted toward the third semiconductor fin.

In yet another aspect of the present disclosure, a semiconductor device is disclosed. The semiconductor device includes a plurality of semiconductor fins that are formed over a substrate. The plurality of semiconductor fins are parallel with one another such that a plurality of trenches are each disposed between adjacent ones of the plurality of semiconductor fins or next to one of the plurality of semiconductor fins. The semiconductor device includes an isolation region comprising a plurality of regions. Each of the plurality of regions is disposed over a respective one of the plurality of trenches. A first one and a second one of the plurality of semiconductor fins include at least respective tip portions bending toward each other.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
   a first semiconductor fin that is formed over a substrate and extends along a first lateral axis;
   a second semiconductor fin that is also formed over the substrate and extends along the first lateral axis, wherein at least a tip portion of the first semiconductor fin and at least a tip portion of the second semiconductor fin bend toward each other along a second lateral axis that is perpendicular to the first lateral axis; and
   a metal gate structure extending along the second lateral axis and straddling both of the first semiconductor fin and the second semiconductor fin.

2. The semiconductor device of claim 1, further comprising an isolation region that is disposed over the substrate and overlays a lower portion of the first semiconductor fin and a lower portion of the second semiconductor fin.

3. The semiconductor device of claim 2, wherein the tip portion of the first semiconductor fin and the tip portion of the second semiconductor fin is separated by a first spacing along the second axis, and a remaining portion of the first semiconductor fin and a remaining portion of the second semiconductor fin is separated by a second spacing along the second axis, and wherein the first spacing is less than the second spacing.

4. The semiconductor device of claim 2, wherein the isolation region includes a first region, a second region, and a third region, and wherein the first region is located between the first and second semiconductor fins, the second region is located opposite the first semiconductor fin from the first region, and the third region is located opposite the second semiconductor fin from the first region.

5. The semiconductor device of claim 4, wherein respective top surfaces of the first, second, and third regions are leveled with one another.

6. The semiconductor device of claim 4, wherein a first height measured from either the tip portion of the first semiconductor fin or the tip portion of the second semiconductor fin to a top surface of the isolation region in the first region, a second height measured from the tip portion of the first semiconductor fin to the top surface of the isolation region in the second region, and a third height measured from the tip portion of the second semiconductor fin to the top surface of the isolation region in the third region are substantially similar to each other.

7. The semiconductor device of claim 1, wherein the tip portion of the first semiconductor fin is laterally shifted from a first vertical axis along which the first semiconductor fin protrudes from the substrate, with a first non-zero distance, and wherein the tip portion of the second semiconductor fin is laterally shifted from a second vertical axis along which the second semiconductor fin protrudes from the substrate, with a second non-zero distance.

8. The semiconductor device of claim 1, further comprising a third semiconductor fin that is also formed over the substrate and extends along the first lateral axis, wherein the third semiconductor fin is disposed between the first and second semiconductor fins.

9. The semiconductor device of claim 8, wherein the first semiconductor fin has a first height, the second semiconductor fin has a second height, and the third semiconductor fin has a third height, and wherein the third height is less than any of the first height and the second height.

10. The semiconductor device of claim 1, further comprising:
a pair of source/drain structures formed in the first semiconductor fin and on opposite sides of the metal gate structure along the first lateral axis.

11. A semiconductor device, comprising:
a first semiconductor fin that is formed over a substrate and extends along a first lateral axis;
a second semiconductor fin that is also formed over the substrate and extends along the first lateral axis, wherein at least a tip portion of the first semiconductor fin and at least a tip portion of the second semiconductor fin bend toward each other along a second lateral axis that is perpendicular to the first lateral axis; and
a third semiconductor fin that is also formed over the substrate and extends along the first lateral axis, wherein the third semiconductor fin is disposed between the first and second semiconductor fins.

12. The semiconductor device of claim 11, wherein the first semiconductor fin has a first height, the second semiconductor fin has a second height, and the third semiconductor fin has a third height, and wherein the third height is less than any of the first height and the second height.

13. The semiconductor device of claim 11, further comprising an isolation region that is disposed over the substrate and overlays a lower portion of each of the first to third semiconductor fins.

14. The semiconductor device of claim 13, wherein the tip portion of the first semiconductor fin and the tip portion of the second semiconductor fin is separated by a first spacing along the second axis, and a remaining portion of the first semiconductor fin and a remaining portion of the second semiconductor fin is separated by a second spacing along the second axis, and wherein the first spacing is less than the second spacing.

15. The semiconductor device of claim 13, wherein the isolation region includes a first region, a second region, and a third region, and wherein the first region is located between the first and second semiconductor fins, the second region is located opposite the first semiconductor fin from the first region, and the third region is located opposite the second semiconductor fin from the first region.

16. The semiconductor device of claim 15, wherein respective top surfaces of the first, second, and third regions are leveled with one another.

17. The semiconductor device of claim 15, wherein a first height measured from either the tip portion of the first semiconductor fin or the tip portion of the second semiconductor fin to a top surface of the isolation region in the first region, a second height measured from the tip portion of the first semiconductor fin to the top surface of the isolation region in the second region, and a third height measured from the tip portion of the second semiconductor fin to the top surface of the isolation region in the third region are substantially similar to each other.

18. A semiconductor device, comprising:
a first semiconductor fin that is formed over a substrate and extends along a first lateral axis;
a second semiconductor fin that is also formed over the substrate and extends along the first lateral axis, wherein at least a tip portion of the first semiconductor fin and at least a tip portion of the second semiconductor fin bend toward each other along a second lateral axis that is perpendicular to the first lateral axis;
a third semiconductor fin that is also formed over the substrate and extends along the first lateral axis, wherein the third semiconductor fin is disposed between the first and second semiconductor fins; and
a metal gate structure extending along the second lateral axis and straddling all of the first to third semiconductor fins.

19. The semiconductor device of claim 18, further comprising an isolation region that is disposed over the substrate and overlays a lower portion of each of the first to third semiconductor fins.

20. The semiconductor device of claim 18, wherein the tip portion of the first semiconductor fin is laterally shifted from a first vertical axis along which the first semiconductor fin protrudes from the substrate, with a first non-zero distance, and wherein the tip portion of the second semiconductor fin is laterally shifted from a second vertical axis along which the second semiconductor fin protrudes from the substrate, with a second non-zero distance.

\* \* \* \* \*